United States Patent
Monfray et al.

(10) Patent No.: US 8,951,425 B2
(45) Date of Patent: Feb. 10, 2015

(54) CURVED PLATE AND METHOD OF FORMING THE SAME

(71) Applicant: STMicroelectronics (Crolles 2) SAS, Crolles (FR)

(72) Inventors: Stéphane Monfray, Eybens (FR); Thomas Skotnicki, Crolles-Monfort (FR); Onoriu Puscasu, Grenoble (FR); Christophe Maitre, Barraux (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 55 days.

(21) Appl. No.: 13/852,676

(22) Filed: Mar. 28, 2013

(65) Prior Publication Data

US 2013/0280549 A1  Oct. 24, 2013

(30) Foreign Application Priority Data

Apr. 2, 2012  (FR) ..................... 12 52997

(51) Int. Cl.
| | | |
|---|---|---|
| *C23F 1/02* | (2006.01) | |
| *H01L 41/332* | (2013.01) | |
| *H01L 41/113* | (2006.01) | |
| *H02N 2/18* | (2006.01) | |
| *B05D 3/02* | (2006.01) | |
| *B05D 3/10* | (2006.01) | |
| *H01L 41/27* | (2013.01) | |
| *H01L 41/33* | (2013.01) | |

(52) U.S. Cl.
CPC ............. *H01L 41/1138* (2013.01); *H02N 2/18* (2013.01); *B05D 3/0254* (2013.01); *B05D 3/107* (2013.01); *H01L 41/27* (2013.01); *H01L 41/33* (2013.01)

USPC ............... 216/13; 216/48; 216/49; 216/67; 216/75; 216/83; 216/100; 430/313; 430/318; 430/319; 430/330; 29/25.35

(58) Field of Classification Search
None
See application file for complete search history.

(56) References Cited

U.S. PATENT DOCUMENTS

| | | | |
|---|---|---|---|
| 6,640,402 B1 * | 11/2003 | Vooren et al. ................ 29/25.35 |
| 7,356,913 B2 * | 4/2008 | Fouillet ............................ 29/622 |
| 7,770,273 B2 * | 8/2010 | Abe et al. .................... 29/25.35 |
| 2007/0000864 A1 * | 1/2007 | Abe et al. ........................ 216/41 |
| 2008/0238260 A1 | 10/2008 | Xu et al. |
| 2010/0295655 A1 | 11/2010 | Pannek |
| 2011/0083714 A1 * | 4/2011 | Descure ........................ 136/239 |

FOREIGN PATENT DOCUMENTS

EP  1384884 A1  1/2004

OTHER PUBLICATIONS

French Search Report and Written Opinion dated Feb. 28, 2013 from corresponding French Application No. 12/52997.
Search Report and Written Opinion dated Nov. 26, 2012 from related French Application No. 12/52996.

* cited by examiner

*Primary Examiner* — Anita Alanko
(74) *Attorney, Agent, or Firm* — Seed IP Law Group PLLC

(57) ABSTRACT

A method of forming at least one curved plate having first and second layers, the first layer being formed of a first material and the second layer being formed of a second material, the method including forming one or more blocks of a fusible material on a surface of a substrate; baking the one or more blocks to deform their shape; and depositing the first and second materials over the one or more deformed blocks to form the first and second layers.

16 Claims, 4 Drawing Sheets

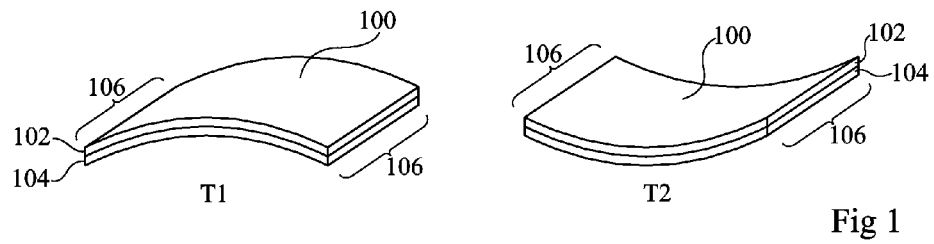
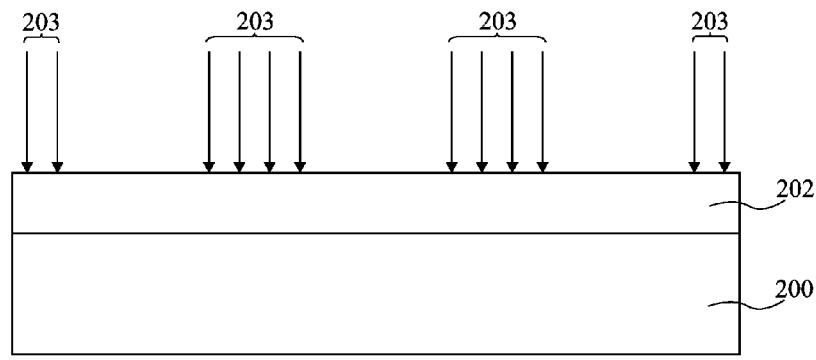
Fig 2A
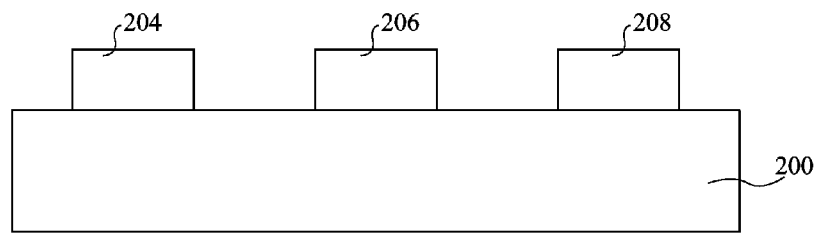
Fig 2B
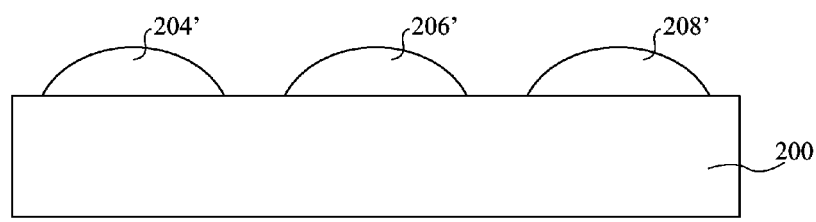
Fig 2C

CURVED PLATE AND METHOD OF FORMING THE SAME

CROSS REFERENCE TO RELATED APPLICATIONS

This application claims the priority benefit of French patent application number 12/52997, filed on Apr. 2, 2012, which is hereby incorporated by reference to the maximum extent allowable by law.

BACKGROUND

1. Technical Field

The present disclosure relates to a curved plate and to a method of forming a curved plate. In particular, the present disclosure relates to a curved plate having two superposed layers and to a method of forming the same.

2. Discussion of the Related Art

Bimetal plates are relatively small plates having two or more layers formed of different metals. For example, the metals have different thermal coefficients of expansion. Thus, under varying temperature conditions, the shape of the bimetal plate changes.

FIG. 1 illustrates an example of a curved bimetal plate 100 in two different states. The bimetal plate 100 comprises a first layer 102 of a first metal, and a second layer 104 of a second metal. The first and second layers have different thermal coefficients of expansion.

The bimetal plate 100 shown on the left in FIG. 1 assumes a temperature T1 of the plate, which is, for example, a temperature of around 50° C., and results in the bimetal plate adopting the form of an arch, its opposite ends 106 curving downwards, and a middle portion curving upwards.

The bimetal plate 100 shown on the right in FIG. 1 assumes a temperature T2 of the plate, which is, for example, an ambient temperature of around 20° C. resulting in the bimetal plate adopting the form of an inverted arch, its opposite ends 106 curving upwards, and its middle portion curving downwards.

Bimetal plates such as plate 100 of FIG. 1 may be used in a variety of applications, such as in thermostats or other forms of thermally activated switches. More recently, it has been proposed to use such elements in energy harvesters, which convert thermal energy into electrical energy.

A method that could be used to form a curved plate such as the bimetal plate 100 of FIG. 1 for example involves stamping two sheets of metal together in the desired form.

In certain applications, including in energy harvesters, it is desirable to provide curved plates of very small dimensions, in the order of tens of micrometers or even just a few micrometers. However, the stamping method indicated above is not adapted to fabricating curved plates having very small dimensions.

SUMMARY

Embodiments at least partially address one or more needs in the prior art.

According to one aspect, there is provided a method of forming at least one curved plate having first and second layers, the first layer being formed of a first material and the second layer being formed of a second material, the method comprising: forming one or more blocks of a fusible material on a surface of a substrate; baking the one or more blocks to deform their shape; and depositing the first and second materials over the one or more deformed blocks to form said first and second layers.

According to one embodiment, the method further comprises, after depositing the first and second materials, selectively etching at least one region of said first and second layers to delimit the at least one curved plate.

According to another embodiment, said baking step transforms said one or more blocks into one or more mounds, and each of said at least one curved plate is delimited to be centred on a peak of a corresponding one of said mounds.

According to another embodiment, said baking step transforms said one or more blocks into one or more mounds, and each of said at least one curved plate is delimited to be centred within a trough between two adjacent mounds.

According to another embodiment, said etching step delimits a plurality of curved plates, each of which is fixed by at least one connecting finger to at least one other curved plate.

According to another embodiment, at least two of said blocks are separated from each other by a spacing, and said baking deforms the shape of said one or more blocks such that their edges meet.

According to another embodiment, the at least one curved plate has a width and/or a length of 50 µm or less.

According to another embodiment, the curved plate has a width and/or a length of 5 µm or less.

According to another embodiment, the at least one curved plate is one of: rectangular in shape; circular in shape; hexagonal in shape; and annular in shape.

According to a further aspect, there is provided a method of manufacturing an energy harvester for converting thermal energy into electrical energy, the method comprising forming at least one curved plate according to the above method, and forming at least one piezoelectric layer on a surface of said energy harvester.

According to a further aspect, there is provided a curved plate having first and second superposed layers, the first layer being formed of a first material and the second layer being formed of a second material, wherein the curved plate has a width and/or a length of 50 µm or less.

According to one embodiment, the curved plate has a width and/or a length of 5 µm or less.

According to another embodiment, said first material has a first thermal coefficient of expansion, and said second material has a second thermal coefficient of expansion different to said first thermal coefficient.

According to another embodiment, said curved plate is a bimetal plate, said first material being a first metal and said second material being a second metal.

According to a further embodiment, there is provided an energy harvester comprising a plurality of the above curved plates.

According to one embodiment, each curved plate comprises a layer of piezoelectric material formed over it.

According to another embodiment, each curved plate is housed in a cavity comprising at least one wall formed of a piezoelectric layer.

BRIEF DESCRIPTION OF THE DRAWINGS

The foregoing and other purposes, features, aspects and advantages will become apparent from the following detailed description of embodiments, given by way of illustration and not limitation with reference to the accompanying drawings, in which:

FIG. 1 (described above) illustrates an example of a curved bimetal plate;

FIGS. 2A to 2G are cross-section views illustrating various stages in a process for forming curved plates according to an example embodiment;

Figure 2D:
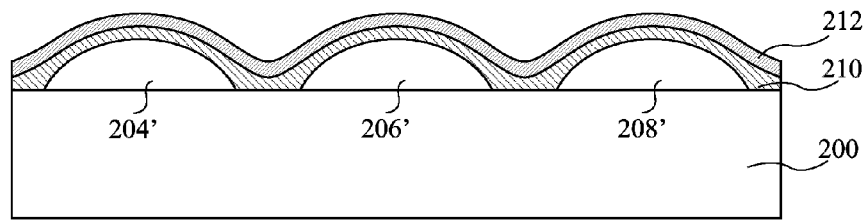

It should be noted that the structures illustrated in the various figures are not drawn to scale, the thicknesses of certain layers in particular being shown to be disproportionately large to aid representation.

Furthermore, throughout the following description, relative orientations such as "top surface" and "bottom surface" are assumed to apply when the corresponding structure is orientated as shown in the drawings.

DETAILED DESCRIPTION

FIGS. 2A to 2G are cross-section views illustrating a structure at various stages in a method of forming curved plates, such as the bimetal plate 100 of FIG. 1.

FIG. 2A illustrates a first view in which a substrate 200, such as a silicon substrate, has formed over it a layer 202 of fusible material, such as a resin. A fusible material is one that is capable of being melted. As will become apparent below, the layer 202 is, for example, also capable of being used as a resist during a photolithography step. For example, the material used for layer 202 is one that becomes soluble to a developer solution after being exposed to UV light or to an electron beam. For example, layer 202 is a microlens photoresist, or other such type of resin.

The thickness of layer 202 will depend on the dimensions and extent of curvature of the curved plates to be formed, and is for example in the range of 1 to 200 μm.

A photolithography step is then used to divide the layer 202 into blocks. For example, layer 202 is photosensitive, and is exposed to UV light represented in FIG. 2A by arrows, via a mask (not illustrated). The layer 202 is then developed using an etching solution, thereby removing the exposed portions. In alternative embodiments, an electron beam could be used rather than UV light. Furthermore, it would also be possible to use a separate resist deposited over layer 202 and developed during the photolithography step to divide layer 202 into blocks.

FIG. 2B illustrates the resulting structure, having for example three blocks 204, 206 and 208 of layer 202 remaining. The blocks 204 to 208, for example, each have a thickness substantially equal to the thickness of layer 202, for example in the range 1 to 200 μm, and a length, corresponding to the left-right direction in FIG. 2B, in the range 1 to 1000 μm. The width of the blocks 204 to 208, which is not represented in FIG. 2B, is, for example, also in the range of 1 to 1000 μm. The blocks, for example, have equal length and width. In some embodiments the blocks 204 to 208 are rectangular in plan view (view not shown in the figures), although many other shapes could be used, such as circular or annular.

In a subsequent step, a reflow process is used to alter the shape of the blocks 204, 206, 208 from a relatively rectangular cross-section to a more rounded shape.

FIG. 2C illustrates an example of mounds 204', 206' and 208' resulting from the melting of blocks 204, 206 and 208 respectively during the reflow process. In particular, the blocks 204 to 208 are baked, for example by placing the substrate 200 on a hot plate or in an oven, such that at least some of the material forming the blocks 204 to 208 melts. The resulting mounds 204', 206', 208' for example have a dome shape or similar form. For example, the baking temperature is between 150° C. and 250° C. The baking duration is, for example, between 10 and 500 seconds. After cooling, the mounds 204' to 208' retain the modified shape illustrated in FIG. 2C.

Depending on the duration and/or temperature of the baking process, the resulting form of the mounds 204' to 208' can be controlled to be more or less spherical. In particular, the longer the baking process, and the higher the baking temperature, the more the material of the blocks 204 to 208 will flow, and the more the surface tensions will result in a semi-spherical shape of the resulting mounds.

For example, the reflow process used to form mounds 204' to 208' corresponds to a reflow process used for forming microlenses based on silicon substrates, as, for example, described in the publication entitled "Study of mechanisms involved in photoresist microlens formation", S. Odrain et al., available at www.signsdirect.com, the contents of which are hereby incorporated by reference to the extent allowable by the law. In such a microlens process, the lenses would correspond to the mounds 204' to 208'.

FIG. 2D illustrates the structure after subsequent steps in which layers 210 and 212 of the materials of the curved plates are deposited over the substrate and mounds 204' to 208'. Optionally, prior to depositing the layers 210, 212, a silicon oxynitride deposition is formed over the substrate 200 and mounds 204' to 208'. For example, in order to form bimetal plates such as the plate 100 of FIG. 1 described above, both of the layers 210, 212 are metals. For example, the layer 210 is of TiN and the layer 212 is of aluminium, or vice versa. Alternative metals that could be used for either of the layers 210, 212 include copper, tungsten, titanium, platinum or any alloy such as FeNi. In some embodiments, either or both of the layers 210, 212 could be formed of a non-metal material. The deposition is, for example, performed by physical vapor deposition (PVD). For example, PVD is performed at around 200° C. or below. Each of the layers 210, 212, for example, has a thickness of between 100 nm and 20 μm.

Figure 2E:
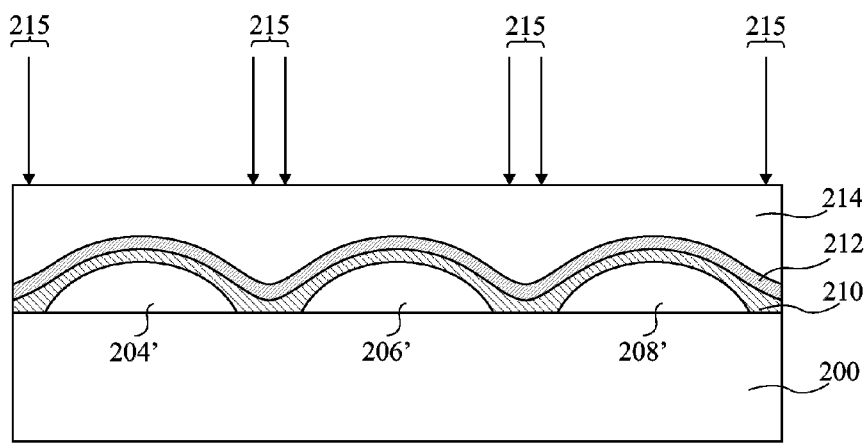

FIG. 2E illustrates the structure during a subsequent photolithography step. For example, a photoresist 214 is deposited over the metal layer 212, and a mask (not illustrated) is used to expose certain regions of the photoresist 214 to UV light. The unexposed regions, which for example correspond to a rectangular zone across the peak of each mound 204' to 208', correspond to the form of the curved plates, as will be explained in more detail hereafter.

Figure 2F:
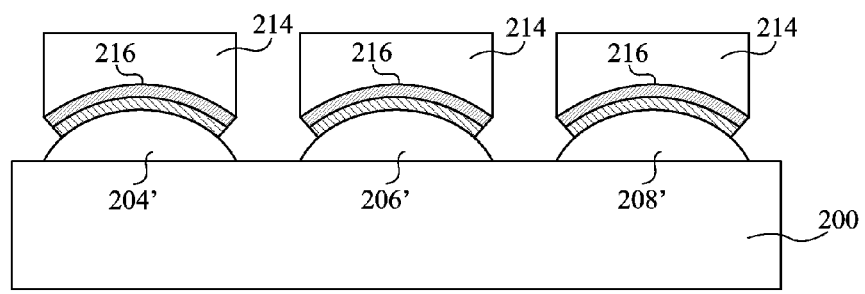

FIG. 2F illustrates the structure after a subsequent step in which the photoresist 214 is developed, and the remaining portions are used as a resist during a subsequent etching of the metal layers 210, 212. Thus the regions of metal layers 210, 212 that remain form curved plates 216. In the example of FIG. 2F, due to the positioning of the mask, the curved plates are each centred over the peak of a corresponding mound 204' to 208'.

Figure 2G:
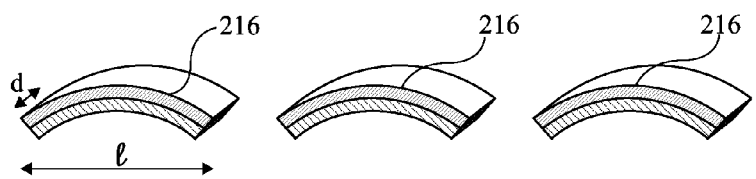

FIG. 2G illustrates the curved plates 216 after the mounds 204', 206', 208' and the remaining portions of the resist layer 214 have been removed, for example by wet or dry etching. In this example, three curved plates 216 are shown as being formed, but it will be apparent to those skilled in the art that the same process could be used to form a different number of curved plates at the same time, for example tens, hundreds or even thousands of curved plates.

The curved plates 216 in FIG. 2G are illustrated in a perspective view, and in this example they have a depth d significantly smaller than their length l, for example by a factor of 2 or more. Thus, assuming that the mounds 204', 206', 208' on which the curved plates are formed are substantially semi-spherical, the extent of curvature of the plates 216 in the depth direction can be far less than in the length direction. Alternatively, non-spherical forms of the mounds 204', 206', 208' could be used to achieve this result.

Depending on the desired form of the curved plates, the baking process described in relation to FIG. 2C for deforming the blocks 204 to 208 may be adapted, as will now be described with reference to FIGS. 3 and 4.

Figure 3:
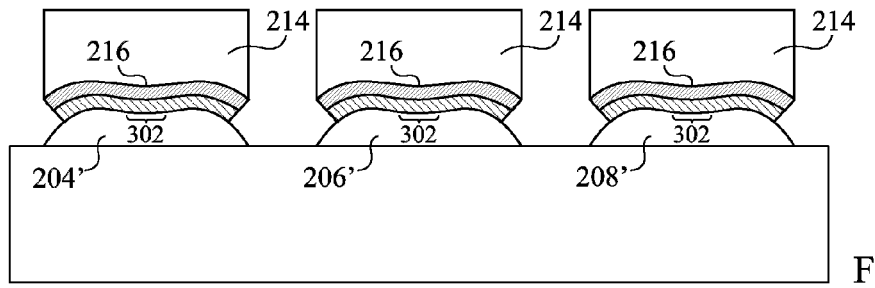
FIGS. 3 and 4 are cross-section views each illustrating the process stage of FIG. 2F according to alternative embodiments.

FIG. 3 is a cross-section view corresponding to the stage in the process of FIG. 2F described above. In this example however, the baking step has been performed such that the blocks 204, 206 and 208 of layer 202 form mounds 204', 206' and 208' respectively, which each have a dip 302 in the middle of their top surface.

Figure 4:
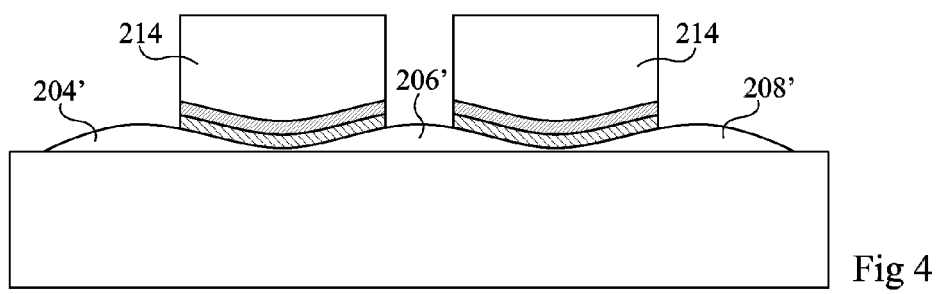

FIG. 4 is a cross-section view also corresponding to the stage in the process of FIG. 2F described above according to an alternative embodiment. In this embodiment, the baking step of FIG. 2C is for example performed to such an extent that the edges of adjacent mounds meet. Furthermore, in this embodiment, the photolithography and etching steps for dividing the metal layers 210, 212 into the curved plates is performed such that the plates are centred over the troughs between the mounds 204', 206', 208', rather than over the peaks of the mounds.

A method of forming curved plates as detailed above, for example, comprises the following steps: forming one or more blocks of material on a surface of a substrate; baking the one or more blocks to deform their shape; and depositing the first and second materials over the one or more deformed blocks to form said first and second layers of the at least one curved plate.

Advantageously, the dimensions of the curved plate 216 thus obtained may be relatively small, for example having a width and/or length of 50 μm or less, or of 5 μm or less in some cases. In other embodiments, the width and/or length of the curved plates could be as low as 1 μm or less, for example down to 100 nm.

In some embodiments, the curved plates 216 are formed such that their change of shape in response to temperature variations is progressive, for example between the two shapes of the bimetal plate 100 illustrated in FIG. 1.

In alternative embodiments, the curved plates 216 are bi-stable, such that they flip rapidly from one shape to another when heated to a first temperature threshold, and back to their original shape when cooled to a second temperature threshold, lower than the first temperature threshold. For example, the curved plates 216 may comprise, as one of the layers 210, 212, a shape-memory material, for example a nickel and titanium alloy. Such a material for example comprises two crystal phases, and is capable of having two stable shapes. Alternatively, the curved plate may have an inward force applied to its ends by one or more springs, resulting in such a bi-stable effect.

While the curved plates 216 shown in FIG. 2G are formed as separate detached elements, alternatively the curved plates 216 could be formed attached together in a matrix, as will now be described with reference to FIGS. 5 and 6.

Figure 5:
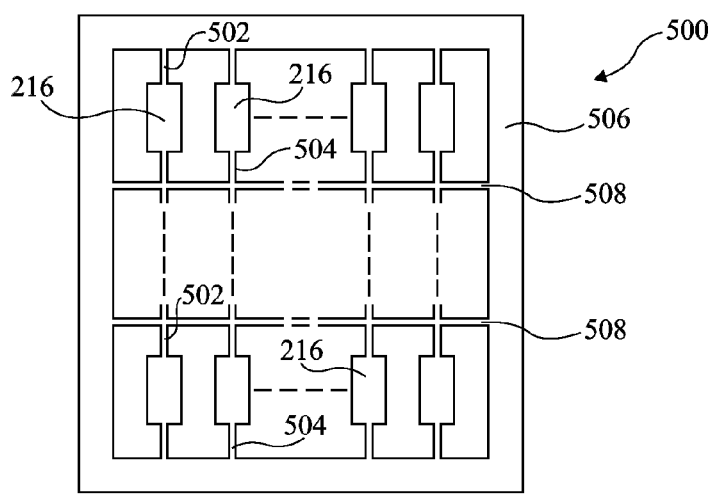
FIGS. 5 and 6 each illustrate, in plan view, a matrix of curved plates according to example embodiments.

FIG. 5 illustrates in plan view an example of a matrix 500 of the curved plates 216. In this example, the plates 216 are rectangular, and arranged in rows. Each of the curved plates in a row is, for example, attached on opposite sides by respective fingers 502, 504 to a grid 506, also, for example, formed of curved layers. In particular, the grid 506, for example, comprises an outer frame and a number of interconnection rails 508 separating each of the rows of curved plates 216. The fingers 502 and 504 of each plate 216 are, for example, coupled to the frame or interconnection rail 508 on either side. The matrix of curved plates could, for example, comprise anything from a plurality of curved plates 216 arranged in one row or column, to hundreds or thousands of curved plates 216 arranged in any number of rows and/or columns.

Figure 6:
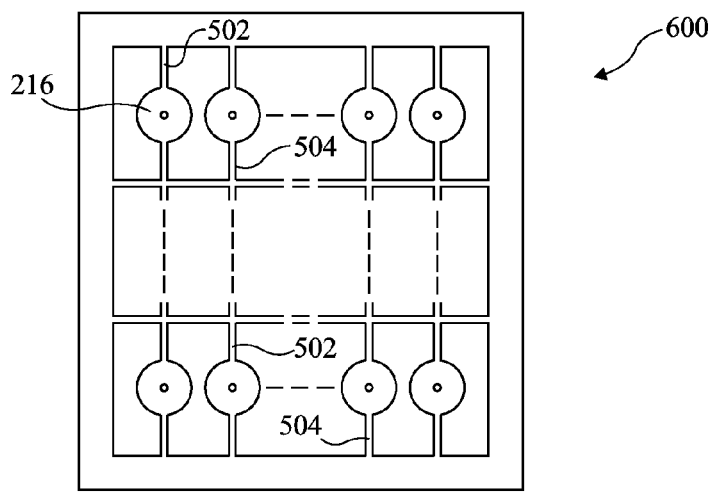

FIG. 6 illustrates in plan view a matrix 600 of curved plates similar to that of FIG. 5, and like features have been labelled with like reference numerals and will not be described again in detail. However, the curved plates 216 in matrix 600 are each circular rather than rectangular. Each curved plate 216 also, for example, comprises a circular hole in the middle, for example having a diameter equal to between 1 and 50 percent of the width (diameter) of the circular curved plate 206. An advantage of providing such a hole is that it modifies the strain configurations, and thus can result in a reduction in the temperature difference between the temperature thresholds at which the curved plate snaps from one shape to the other. This leads to an increase in the snapping frequency.

The curved plates 216 individually, or in the form of the matrices of FIGS. 5 and 6, have variations applications, one of which is a thermal energy harvester, as will now be described in relation to FIGS. 7A to 9.

Figure 7A:
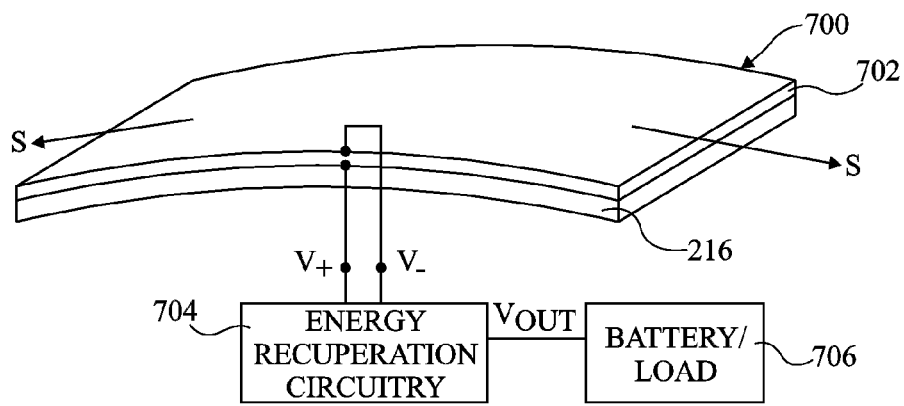
FIG. 7A illustrates a thermal energy harvester according to an example embodiment.

FIG. 7A illustrates an example of a curved plate 700 used as an energy harvester for converting thermal energy into electrical energy. Such a plate is, for example, described in US patent application NUS2011/083714. The curved plate 700, for example, comprises the curved plate 216 as described herein, over which is formed a superposed layer 702 of piezoelectric material. Piezoelectric material is a material that has the property of generating a voltage difference between its main surfaces that varies depending on the stress applied to it. For example, the piezoelectric material is formed of PZT (lead zirconate titanate), of another compound based on lead and zirconium, or of ZnO. During a shape change of the curved plate 700, for example from the shape of the left-hand plate to the shape of the right-hand plate in FIG. 1, a stress S occurs in the piezoelectric layer 702, represented by arrows S in FIG. 7A.

Energy recuperation circuitry (ENERGY RECUPERATION CIRCUITRY) 704 is, for example, coupled to the top and bottom surfaces of the piezoelectric layer 702, and recuperates the energy resulting from the voltage changes across these surfaces. This is used to generate an output voltage $V_{OUT}$ from the energy recuperation circuitry 704, which is, for example, used to charge or supply a battery/load (BATTERY/LOAD) 706.

While not illustrated in FIG. 7A, in operation, a middle section of the curved plate 700 is arranged to contact a relatively hot plate, for example below the plate 700, when the plate 700 is in the form of an inverted arch, and to contact a relatively cold plate, for example above the plate 700, when the plate 700 is in the form of an arch.

Rather than using a piezo-electric layer, other transducing methods could be used for transforming the mechanical energy of the plate 700 into electrical energy, such as capacitive variations.

Figure 7B:
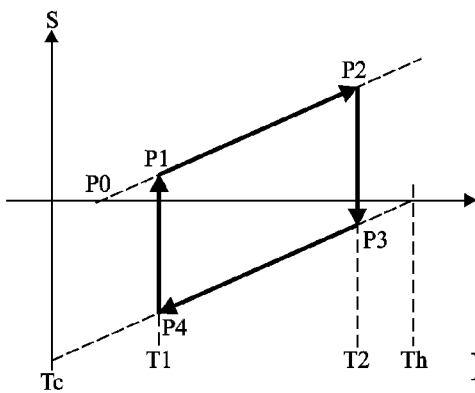
FIG. 7B is a graph showing examples of stress levels present in a curved plate according to an example embodiment.

FIG. 7B is a graph illustrating the operating principle of the energy harvester 700 of FIG. 7A, and illustrates the variation of mechanical stress S in the piezoelectric layer 702 according to temperature T of the curved plate 700.

In an initial phase P0, the heat source is, for example, not established and the temperature of the plate is lower than threshold T1. The curved plate 700 is thus in a first shape in which its middle section is in contact with a hot wall of the generator, and the hot wall starts to heat up progressively.

Once heated past a temperature T1, the energy harvester then periodically follows a cycle P1-P2-P3-P4.

At point P1, the plate temperature is equal to the first threshold, T1, and the membrane is in its first shape, in contact with the hot wall. The plate temperature progressively increases, between points P1 and P2, which results in a progressive variation of the stress in the piezoelectric material, due to the expansion of the lower metal layer of the plate 700. This causes a progressive small variation of the output voltage of the generator.

At point P2, the plate temperature reaches the second threshold, T2, at which its shape changes. The plate 700 then abruptly takes its second shape and comes into contact with the cold wall of the harvester. This results in an abrupt variation of the mechanical stress in the piezoelectric layer, causing an abrupt peak voltage at the output terminals of the harvester.

Then, from point P3, the temperature of the plate 700, which is contact with the cold wall, progressively decreases, thus causing a progressive variation of the stress in the piezoelectric material. This results in a small progressive variation of the voltage at the output terminals of the energy harvester.

At point P4, the plate temperature reaches the first threshold, T1, at which its shape changes. The plate 700 then abruptly recovers its first shape and comes into contact with the hot wall of the generator. This results in an abrupt variation of the stress in the piezoelectric layer, causing an abrupt peak voltage at the output terminals of the generator. The cycle then resumes from phase P1.

Thus, the thermal power of the hot wall is transferred by the curved plate 700 to the cold wall by increments. This transfer causes abrupt movements of the curved plate 700, which is partially converted into electric power.

As will be described in more detail below, rather than being formed on the curved plate 216, the piezoelectric layer could be formed on the surface of the hot and/or cold wall.

For example, the temperature difference between thresholds T1 and T2 at which the curved plate changes shape is relatively large with respect to the range of temperature variations of the device. As an example, if temperatures Th and Tc of the hot and cold walls respectively are 50 and 20° C., the curved plate, for example, has respective shape change thresholds T1 and T2 at 25° C. and 45° C. respectively. In alternative embodiments, there could be a reduced hysteresis, the thresholds T1 and T2, for example, being separated by only a few degrees. For example, T1 and T2 could be at 35° C. and 40° C.

To improve the thermal contact between the curved plate and the hot and cold walls, an oil film or a thermally-conductive paste is, for example, provided on each of the wall and/or on the surfaces of the plate.

The present inventors have found that an energy harvester formed of a curved plate, such as the plate 700 of FIG. 7A, having a given length l, width w and a thickness e, can be made significantly more efficient by instead providing more plates each of a reduced surface area. For example, plate 700 could be replaces by $n^2$ curved plates, each having a length of l/n, a width of w/n and a thickness e/n. More generally, for a given surface area A of a single curved plate, performance could be improved by providing a plurality of curved plates having the same total surface area A, even assuming that the thickness of each of the plurality of plates is proportionally smaller. For example, the overall mechanical power for a given surface could be increased by as much as a factor of n. Furthermore by reducing the thickness of the curved plate, the frequency that the curved plate switches between its states can be increased. As an example, assuming that the thickness is reduced by a factor of n, the frequency that the curved plate switches is, for example, increased by as much as a factor $n^2$, leading to a higher frequency of the generated voltage signal.

Figure 7C:
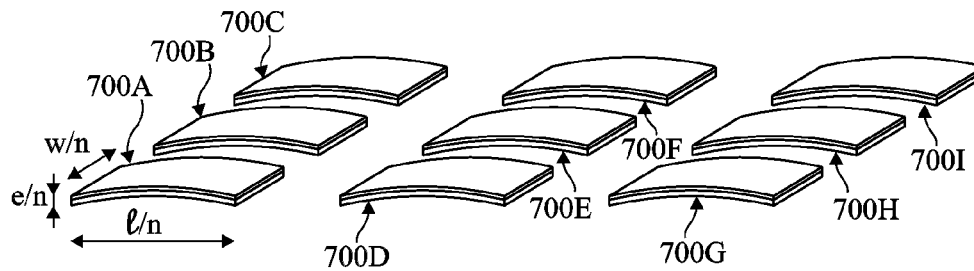
FIG. 7C illustrates a plurality of curved plates forming a thermal energy harvester according to an example embodiment.

FIG. 7C illustrates an example in which the curved plate 700 of FIG. 7A is replaced by nine curved metal plates 700A to 700I, each having a length of l/3, a width of w/3, and a thickness of e/3. Thus the power density is, for example, increased by as much as a factor of 3, and the switching frequency of each plate is, for example, increased by as much as a factor of 9, with respect to the curved plate 700. Of course, the same principle could be applied to any plurality of plates n. Thus there is a particular benefit in decreasing the size of each curved plate in an energy harvester of a given area.

Figure 8:
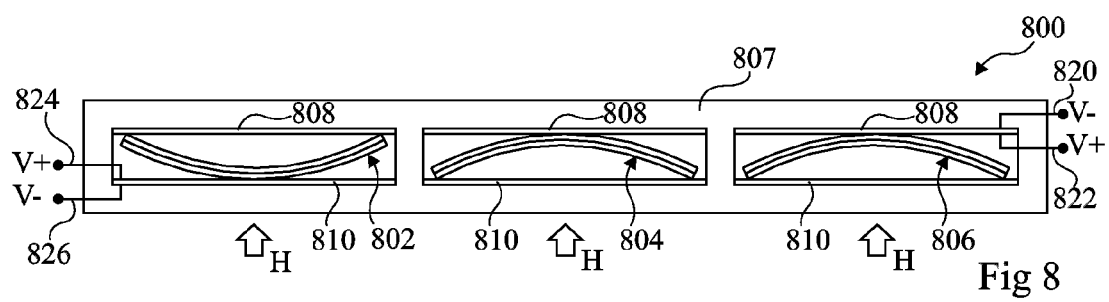
FIGS. 8 and 9 are cross-section views illustrating thermal energy harvesters according to example embodiments.
Figure 9:
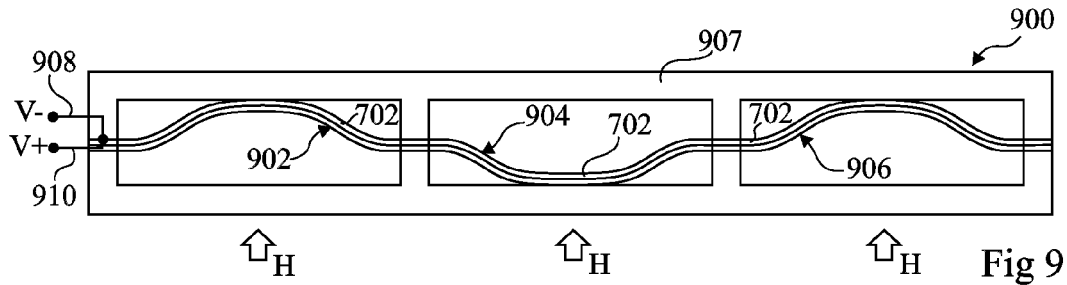

FIGS. 8 and 9 are cross-section views illustrating examples of thermal energy harvesters comprising the curved plates 216 described herein.

FIG. 8 illustrates an energy harvester 800 comprising curved plates 802, 804 and 806, each, for example, corresponding to the curved plate 216, and which is, for example, bi-stable as described above. Each plate 802 to 806 is independently housed within a corresponding cavity created by a structure 807, for example, formed of a polymer material. Piezoelectric layers 808 are, for example, formed on a top surface inside each of the cavities, and/or piezoelectric layers 810 are, for example, formed on a bottom surface inside each of the cavities. The top surfaces of the piezoelectric layers 808 are, for example, electrically coupled to an output terminal 820 providing an output signal $V_-$, while the bottom surfaces of each piezoelectric layers 808 are, for example, electrically coupled to an output terminal 822 providing an output signal $V_+$. Similarly, the top surfaces of the piezoelectric layers 810 are, for example, electrically coupled to an output terminal 824 providing an output signal $V_+$, while the bottom surface of each of the piezoelectric layers 810 is, for example, electrically coupled to an output terminal 826 providing an output signal $V_-$.

In operation, heat, represented by an arrow H in FIG. 8, is applied to the underside of the energy harvester 800. The heat could originate from any source, such as from solar energy, from a warm pipe, from an electrical component, etc. This heat, for example, raises the temperature of the curved plates having their middle sections in contact with the hot wall at the bottom of the corresponding cavity, and once their temperature reaches an upper threshold, their shape changes, causing their middle section to hit the piezoelectric layer 808 on the top surface of the corresponding cavity, thus generating a corresponding voltage signal. The middle section of the plate now being in contact with the relatively cool top wall of the cavity, the plate cools down. When the temperature goes below a lower threshold, the curved plate changes shape again, its middle section hitting the piezoelectric layer 810 on the bottom of the corresponding cavity, thus generating a corresponding voltage signal. The top and bottom walls of the energy harvester 800 are, for example, insulated in order to maintain a temperature difference between these top and bottom walls. To aid this, a partial vacuum is, for example, present in each of the cavities.

While not represented in FIG. 8, the energy recuperation circuitry 704 of FIG. 7A is, for example, provided for converting energy from the voltage signals $V_+$, $V_-$ into a supply voltage for charging or supplying the battery/load 706.

FIG. 9 illustrates an energy harvester 900 comprising curved plates 902, 904 and 906, each of which, for example, has a structure similar to that of the plate 700 of FIG. 7A, comprising a superposed layer of piezoelectric material. The energy harvester 900 is similar to the energy harvester 800 of FIG. 8, in that it comprises a structure 907, for example formed of a polymer material, having cavities housing the respective curved plates 902, 904, 906. In the example of FIG. 9, the plates 902 to 906 are formed in a matrix, for example one similar to that of FIG. 5 or 6 described above, joined together by fingers embedded in the walls on each side of each cavity. Alternatively, only one of the fingers could be provided. The top surface of the piezoelectric layer of each plate 902 to 906 is, for example, electrically coupled to an output terminal 908 providing an output signal $V_-$, while the layers of each curved plate 902 to 906, for example, provide an electrical connection to the bottom side of each curved plate 902 to 906, and is, for example, coupled to an output terminal 910 providing an output voltage signal $V_+$. While not represented in FIG. 9, the energy recuperation circuitry 704 of FIG. 7A is, for example, provided for converting energy from the signals $V_+$, $V_-$ into a supply voltage for charging or supplying the battery/load 706.

An advantage of the method of forming a curved plate described herein is that it permits the curved plate to have relatively low dimensions, for example a length and/or width of 50 µm or less, of 5 µm or less, or even as low as 5 µm or less.

While a number of specific embodiments of a method and device have been described herein, it will be apparent to those skilled in the art that there are various modifications and alterations that could be provided.

For example, it will be apparent to those skilled in the art that while the application of the curved plates in an energy harvester has been described, there are many other applications, such as thermostats, etc.

Furthermore, it will be apparent to those skilled in the art that the method described above for manufacturing curved plates could be applied to a wide range of types of such plates formed of two layers of material. The particular dimensions and types of material will depend on the application.

The various features described in relation with the various embodiments could be combined, in alternative, embodiments, in any combination.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of forming a plurality of curved plates having first and second layers, the first layer being formed of a first material and the second layer being formed of a second material, the method comprising:

forming a plurality of blocks of a fusible material on a surface of a substrate;

baking the plurality blocks to deform their shape;

depositing the first and second materials over the plurality of deformed blocks to form said first and second layers; and after depositing the first and second materials, selectively etching the first and second layers to delimit the plurality of curved plates, each of the curved plates being fixed by at least one connecting finger to at least one other curved plate.

2. The method of claim 1, wherein said baking transforms said plurality of blocks into a plurality of mounds, and wherein each of the plurality of curved plates is delimited to be centred on a peak of a corresponding one of said mounds.

3. A method of forming at least one curved plate having first and second layers, the first layer being formed of a first material and the second layer being formed of a second material, the method comprising:

forming one or more blocks of a fusible material on a surface of a substrate;

baking the one or more blocks to deform their shape;

depositing the first and second materials over the one or more deformed blocks to form said first and second layers; and after depositing the first and second materials, selectively etching at least one region of said first and second layers to delimit the at least one curved plate, wherein said baking transforms said one or more blocks into one or more mounds, and wherein each of said at least one curved plate is delimited to be centred within a trough between two adjacent mounds.

4. A method of forming at least one curved plate having first and second layers, the first layer being formed of a first material and the second layer being formed of a second material, the method comprising:

forming one or more blocks of a fusible material on a surface of a substrate;

baking the one or more blocks to deform their shape;

depositing the first and second materials over the one or more deformed blocks to form said first and second layers; and after depositing the first and second materials, selectively etching at least one region of said first and second layers to delimit the at least one curved plate, wherein at least two of said blocks are separated from each other by a spacing, and wherein said baking deforms the shape of said one or more blocks such that their edges meet.

5. The method of claim 4, wherein the at least one curved plate has at least one of a width and a length of 50 µm or less.

6. The method of claim 1, wherein the plurality of curved plates have at least one of a width and a length of 5 µm or less.

7. The method of claim 1, wherein the plurality of curved plates in plan view is one of:

rectangular in shape;

circular in shape;

hexagonal in shape; and annular in shape.

8. A method of manufacturing comprising:

forming an energy harvester for converting thermal energy into electrical energy, the forming including:

forming a plurality of curved plates, the forming including:

forming a plurality of blocks of a fusible material on a surface of a substrate;

baking the plurality of blocks to deform a shape of the plurality of blocks; and depositing a first material on the plurality of deformed blocks;

depositing a second material on the first material and over the plurality of blocks;

removing portions of first and second materials, the portions being located between the plurality of blocks; and forming a piezoelectric layer over said energy harvester.

9. The method of claim 8, wherein forming the piezoelectric layer over said energy harvester comprises forming the piezoelectric layer on a surface of said energy harvester.

10. The method of claim 8, wherein forming the piezoelectric layer over said energy harvester comprises forming the piezoelectric layer on surfaces of cavities that house the curved plates, respectively.

11. The method of claim 10, wherein removing portions of first and second materials comprises etching the first and second materials to remove the portions of the first and second materials.

12. The method of claim 8, wherein forming the plurality of curved plates comprises forming the plurality of curved plates in a matrix arrangement.

13. The method of claim 8, wherein each of the curved plates is fixed to at least one other curved plate by a connecting finger.

14. The method of claim 3, wherein selectively etching the at least one region of said first and second layers to delimit the at least one curved plate comprises selectively etching a plurality of regions of said first and second layers to delimit a plurality of curved plates.

15. The method of claim 1, wherein at least two of the plurality of blocks are separated from each other by a spacing, and wherein said baking deforms the shape of the plurality of blocks such that the edges of the at least two of the plurality of blocks meet.

16. The method of claim 1, wherein said baking transforms the plurality of blocks into a plurality of mounds, and wherein each of said at least one curved plate is delimited to be centred within a trough between two adjacent mounds.

* * * * *